United States Patent [19]

Sugimura et al.

[11] Patent Number: 4,847,856
[45] Date of Patent: Jul. 11, 1989

[54] PHASE-SHIFT DISTRIBUTED-FEEDBACK SEMICONDUCTOR LASER

[75] Inventors: Akira Sugimura; Tatsuya Kimura, both of Tokyo, Japan

[73] Assignee: Nippon Telegraph and Telephone Corporation, Tokyo, Japan

[21] Appl. No.: 186,181

[22] Filed: Apr. 26, 1988

[30] Foreign Application Priority Data

Apr. 27, 1987 [JP] Japan ................................. 62-104065
Mar. 11, 1988 [JP] Japan .................................. 63-58012

[51] Int. Cl.$^4$ ............................................... H01S 3/08
[52] U.S. Cl. ...................................... 372/96; 372/26; 372/32; 372/50
[58] Field of Search ...................... 372/96, 46, 26, 50, 372/29, 32

[56] References Cited

U.S. PATENT DOCUMENTS

| 4,701,930 | 10/1987 | Akiba et al. | 372/96 |
| 4,751,719 | 6/1988 | Mito et al. | 372/96 |
| 4,775,980 | 6/1988 | Chinoue et al. | 372/96 |

OTHER PUBLICATIONS

*J. Appl. Phys.* vol. 43, No. 5, May 1972, pp. 2327–2335 "Coupled-Wave Theory of Distributed Feedback Lasers" by H. Kogelnik et al.
*Electronics Letters* Mar. 28, 1985 vol. 21, No. 7 pp. 283–285 "Realisation of Flat FM Response by Directly Modulating a Phase Tunable DFB Laser Diode" by S. Yamazaki et al.
Proc. Opt. Fiber Conf., Atlanta, Tuesday Morning, Feb. 25, 1986 Salon II Tufi "Independent Modulation in Amplitude and Frequency Regimes by a Multielectrode Distributed–Feedback Laser" by Y. Yoshikuni et al.
*Electronics Letters* Oct. 24, 1985 vol. 21 No. 22 pp. 1046–1048 "Measured Dynamic Linewidth Properties of a 1.5 $\mu$m DFB–GRIN–ROD Coupled-Cavity Laser Under Direct High-Frequency Modulation" by T. P. Lee et al.
*Electronics Letters* Nov. 24, vol. 19, No. 24 pp. 1026–1027 "Semiconductor Laser Linewidth in Optical Feedback Configurations" by E. Patzak et al.
*Electronics Letters* Jan. 2, vol. 22, No. 1 pp. 5–7 "Long-Span Optical FSK Heterodyne Single-Filter Detection Transmission Experiment Using a Phase-Tunable DFB Laser Diode" by S. Yamazaki et al.
*IEEE Journal of Quantum Electronics*, vol. QE–12, No. 9, Sep. 1976 pp. 532–539 "Antisymmetric Taper of Distributed Feedback Lasers" by H. Hans et al.
*Proc. I.E.E.E. Semiconductor Laser Conference*, Kanagawa 1986 E–2 pp. 60–61 "Stability in Single Longitudinal Mode Operation in GaIn AsP/InP Phase Adjusted DFB LD'S" by H. Soda et al.

*Primary Examiner*—James W. Davie
*Attorney, Agent, or Firm*—Blakely, Sokoloff, Taylor & Zafman

[57] ABSTRACT

A phase-shift distributed-feedback semiconductor laser includes an electrode for injecting a current to the entire area of the semiconductor laser. The laser also includes portions each for shifting an optical phase by a 1/4 wavelength at at least three locations, the number of which is an odd number. These portions are formed in a light propagation direction of the phase-shift distributed-feedback semiconductor laser structure.

7 Claims, 6 Drawing Sheets

PHASE-SHIFT DISTRIBUTED-FEEDBACK SEMICONDUCTOR LASER

BACKGROUND OF THE INVENTION

The present invention relates to a phase-shift distributed-feedback semiconductor laser.

Along with the development of various new optoelectronic products, semiconductor laser devices are used as stable light sources in a variety of applications. In applications such as coherent optical systems and photosensor systems, semiconductor lasers having a narrow spectral line width are required. A demand also has arisen for improving FM modulation characteristics when semiconductor lasers are used as light sources for coherent optical communication.

One of the conventional apparatuses characterized by a narrow spectral width is an apparatus constituting a cavity using an external mirror (E. Patzak, A. Sugimura, S. Saito, T. Mukai, and H. Olexen, Electron. Lett. Vol. 19, P. 1026 (1983); and T. P. Lee et. al. Electron. Lett., Vol. 21, P. 1048 (1985)). Since the external mirror is not integrated on a semiconductor chip, the apparatus is not mechanically and thermally stable.

Figure 1A:
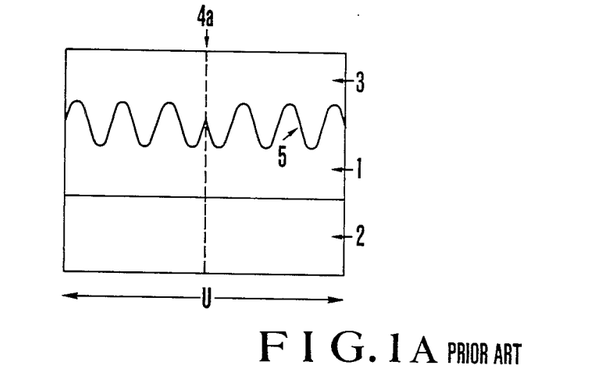
FIGS. 1A and 1B are sectional views showing conventional phase-shift distributed-feedback lasers.
Figure 1B:
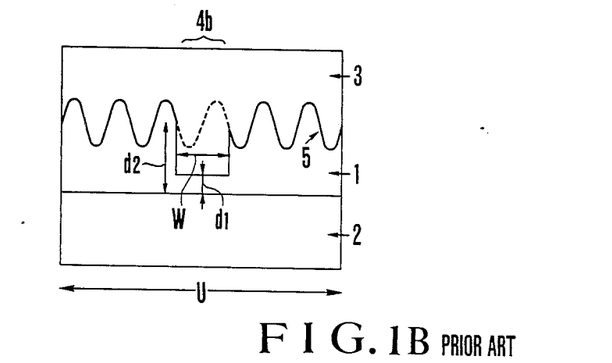

Another conventional example is a phase-shift distributed-feedback semiconductor laser, the main part of which is shown in FIGS. 1A and 1B (H. Haus and C. Shank, IEEE, J. Quantum Electron., Vol. QE-12, P. 532 (1976)). The properties of this semiconductor laser will be described with reference to FIGS. 1A and 1B.

Reference numeral 1 denotes an active layer for performing optical amplification; 2 and 3, cladding layers for confining light; and 5, a diffraction grating formed at a boundary between the cladding layers 1 and 3 to feed back light in a distributed manner.

The structure shown in FIG. 1A belongs to a distributed-feedback semiconductor laser (DFB laser) because the diffraction grating is formed to spatially modulate an equivalent refractive index distribution and to feed back the light in a distributed manner. Noted that only the main part of the laser is shown in FIGS. 1A and 1B, and elements such as electrodes and an antireflection coating film are not illustrated.

The structure in FIG. 1A has unique characteristics unlike a simple distributed-feedback semiconductor laser. A phase of the diffraction grating 5 is shifted by a half wavelength at a central portion of the cavity. A junction plane 4a is formed such that the phase of light transmitted through the central portion of the cavity is shifted by a ¼ wavelength since the phase of the equivalent refractive index distribution upon spatial modulation is shifted by a half wavelength, as is well known to those skilled in the art.

In a conventional DFB structure without the ¼ wavelength phase shift, minimum external coupling loss occurs at two resonance frequency portions, which is shifted from the Bragg frequency $f_0$ by a predetermined frequency ($f_1$). In other words, two optical modes having frequencies $f_0 \pm f_1$ are present. In the structure where the phase shift portion 4a shown in FIG. 1A is formed, the phase of a light component is shifted when it travels through the phase shift portion 4a. The number of resonance modes for giving the minimum external coupling loss is reduced to one, and its resonance frequency coincides with the Bragg frequency $f_0$. Therefore, stable single mode oscillation can be achieved.

The above description is associated with the structure shown in FIG. 1A. It is known that a practical structure for shifting the optical phase by a ¼ wavelength can be easily achieved in other structures. More specifically, by partially omitting the diffraction grating, the thickness (d1) of the active layer 1 under this portion (4b) can be made different from the thickness (d2) of the portion above which the diffraction grating is present. In addition, when the width W of the no diffraction grating portion is properly set by a relationship between the thicknesses d2 and d1, the same effect as in FIG. 1A can be obtained. That is, the phase of light propagating through the laser device can be shifted by a ¼ wavelength through the portion (4b). Therefore, stable single mode oscillation can be achieved in the structure of FIG. 1B.

The phase-shift distributed-feedback semiconductor laser shown in FIGS. 1A and 1B is more effective than the simple distributed-feedback semiconductor laser (DFB) without a phase-shift as far as the mode property is improved from a plural to single mode oscillation. However, no consideration has been made to obtain a narrow spectral width of light oscillated in the single mode. This conventional structure, however, has a decisive drawback (to be described in detail below) in that the spectral width cannot be sufficiently narrowed even if structure parameters such as a cavity length are optimized.

A spectral line width $\Delta\nu$ of the distributed-feedback (DFB) semiconductor laser using a diffraction grating is represented as follows:

$$\Delta\nu = (K/L)(\alpha_0 + \alpha_{th}L/L)(1/(J/J_{th}-1)) \qquad (1)$$

where K is the constant depending primarily on semiconductor material parameters, L is the overall cavity length, $\alpha_0$ and $\alpha_{th}$ are the internal cavity loss and the external coupling loss per unit length respectively, J is the injection current, and $J_{th}$ is the threshold current. Note that $\alpha_0$ is the constant depending on the device fabrication conditions.

$\alpha_{th}L$ is a value depending on the structure and can be obtained as a function of L and a coupling constant $\kappa$, which corresponds to the feedback strength, by solving a coupled mode equation accompanied with boundary conditions, wherein the coupling constant $\kappa$ is a value proportional to the depth of the groove of the diffraction grating, i.e., the depth of spatial modulation of the equivalent refractive index.

Figure 2:
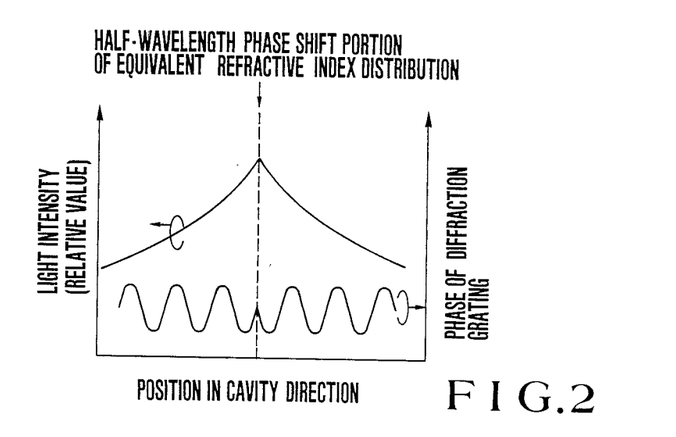
FIG. 2 is a graph showing a light intensity distribution of the conventional phase-shift distributed-feedback laser shown in FIG. 1.

The spectral width $\Delta\nu$ of the DFB laser decreases, according to equation (1), when the cavity length L is increased, and the magnitude of the injection current J is set to be larger compared to the threshold current $J_{th}$. The spatial hole burning effect are imposed as limitations on the spectral width of the DFB laser having the ¼ wavelength phase-shift portion shown in FIGS. 1A and 1B. The light intensity distribution inside the cavity of this structure is known to have a shape strongly concentrated and confined at the center when the dimensionless feedback strength $\kappa L$ is large, as shown in FIG. 2.

The mode behavior such as the light intensity distribution is given as a function of a dimensionless feedback strength $\kappa L$, i.e., the product of the constant representing the feedback strength and the cavity length L, because the coupled mode equation is kept constant with respect to L scale conversion, i.e., all structure and mode parameters can be normalized by the length so as to obtain dimensionless values.

When the feedback strength $\kappa L$ is large, the dimensionless external coupling loss $\alpha_{th}L$ can also be derived as follows:

$$\alpha_{th}L = (\kappa L/\sinh(\kappa L/2))(\cosh(\kappa L/2) - \sinh(\kappa L/2)) \quad (2)$$

A substitution of equation (2) into equation (1) yields the relationship between the oscillation spectral width $\Delta\nu$ and the cavity length L in the conventional phase shift distributed-feedback semiconductor laser shown in FIGS. 1A and 1B. $\alpha_{th}L$ is a decreasing function with respect to the feedback strength $\kappa L$. Therefore, when the injection current J is kept constant, the oscillation spectral width $\Delta\nu$ can be narrowed in accordance with an increase in the cavity length L, as indicated by a solid curve in FIG. 8.

However, it is impossible to keep the injection current constant without causing the instability of the laser oscillation when the cavity length L is extended, as will be described in the following. As described above, the structure shown in FIGS. 1A and 1B has the peaked light intensity distribution in the cavity, as shown in FIG. 2. When the feedback strength $\kappa L$ is increased, the distribution is strongly concentrated at the center. The injection current J is a function of the constant $\kappa$ and the overall cavity length L. Therefore, when the injection current J is increased, the number of carriers near the center of the cavity is decreased as compared with that near the end faces of the cavity in the light intensity distribution due to the reason described below. The magnitude of the stimulated emission is proportional to the light intensity and thus the stimulated emission is stronger where the light intensity is strong. When the stimulated emission is strong, more carriers are used for the stimulated emission. Thus, the number of carriers decreases at the point where the light intensity is strong.

The shape of the carrier distribution is a V-shaped distribution where the central portion is recessed, as opposed to an inverted V-shaped distribution of the light intensity where the central portion is the highest peak shown in FIG. 2. A phenomenon in which a shortage of carriers locally occurs is called spatial hole burning effect. In the present case, the spatial hole burning effect occurs along the axial direction of the cavity. Nonuniformity of the carrier distribution causes that of the refractive index distribution since the change in refractive index is proportional to the number of carriers. Nonuniformity of the refractive index distribution causes a change in light intensity distribution in the oscillation mode due to the change of the amount of the distributed feedback in the presence of the grating. As a result, for example, a mode of a higher order may be oscillated, and thus the oscillation becomes unstable.

Figure 8:
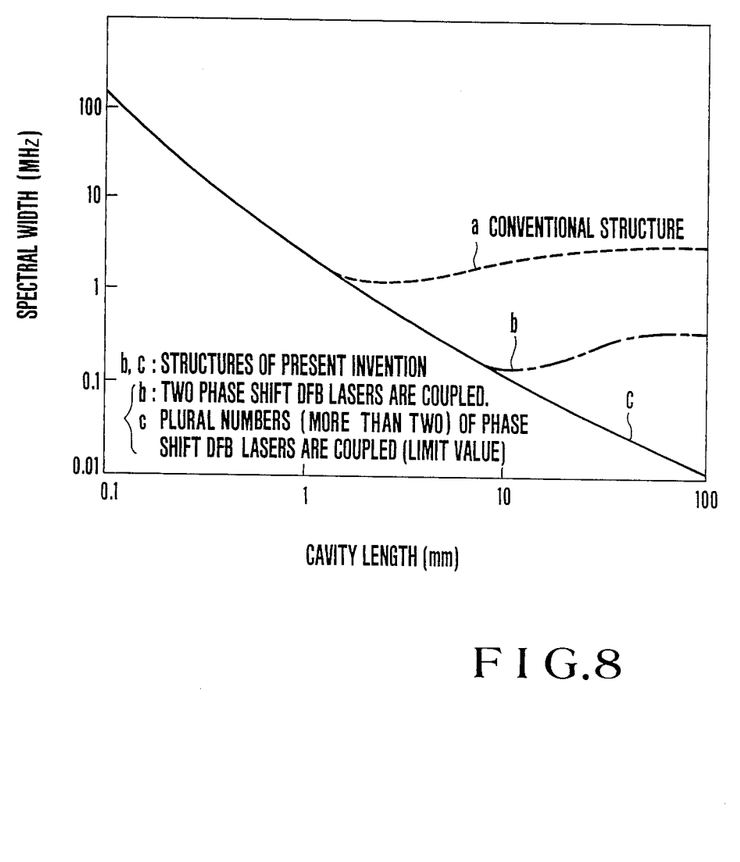
FIG. 8 is a view showing the spectral width as a function of the cavity width for the conventional example and the present invention.

Under the condition that the stable single mode oscillation is guaranteed, the oscillation spectral line width $\Delta\nu$ is saturated even if the cavity length is increased, as indicated by a dotted line in FIG. 8. Therefore, this width cannot be further decreased, as indicated by a dotted line a in FIG. 8. The dotted line a in FIG. 8 indicates an analyzed result when the feedback strength $\kappa L$ is set to be 1.25 so as to optimally stabilize the oscillation mode in the conventional structure. In order to stabilize the mode in the conventional structure, a structure which has a light intensity distribution as flat as possible and can minimize hole burning, i.e., a structure having a feedback strength of around 1.25 is reported to be preferable (H. Soda et. al., Proc. I.E.E.E., Semiconductor Laser Conference, Kanazawa, 1986). In other words, under the condition of stable single mode oscillation, only the oscillation spectral width corresponding to about 1 MHz can be obtained in the conventional structure.

Figure 3A:
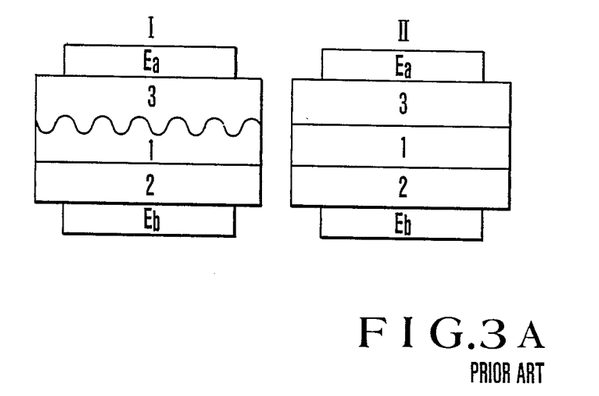
FIGS. 3A and 3B are views showing conventional structures which give optical FM modulation.

A conventional FM modulation scheme for a semiconductor laser is shown in FIG. 3A (S. Yamazaki et. al., Electron. Lett., Vol. 22, P. 5 (1986)). A constant current is supplied to a DFB laser I to cause oscillation in a stable mode. When an injection current supplied to a laser II is modulated around the value smaller than the threshold value, a reflectivity at the right facet of the laser I is effectively modulated by the refractive index modulation of the laser II, thereby causing FM modulation. According to this scheme, FM modulation strongly depends on the phase of the DFB grating at the facet, and therefore, modulation characteristics undesirably vary between the devices produced at a time.

Figure 3B:
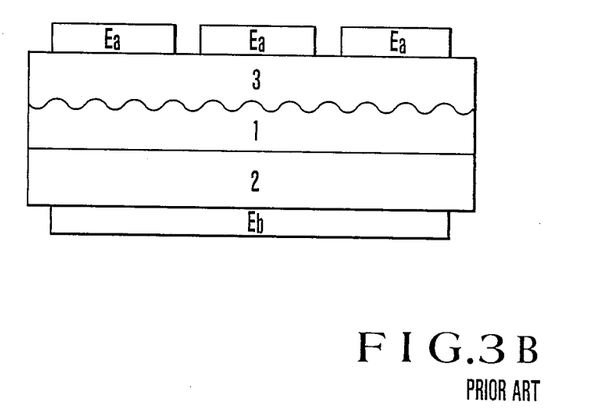

Still another conventional example is shown in FIG. 3B. In a structure obtained by dividing an electrode of a DFB laser into 3 electrodes, different injection currents are applied to electrodes and an asymmetrical refractive index distribution can be obtained. Therefore, the oscillation mode can be changed (Y. Yoshikuni and G. Motosugi, Proc. Opt. Fiber Conf., Atlanta, 1986). When a bias current in good conditions is supplied to each electrode and modulation currents of opposite phases are applied to an end electrode and the central electrode, the DFB structure can be oscillated in the single mode to achieve FM modulation free from an AM component. According to this scheme, the oscillation frequency and the modulation characteristics are changed depending on operating conditions, and thus the conditions must be set upon at every operation. Long-term stability and uniformity of the device characteristics used at remote locations cannot be perfectly satisfied. Reference numerals and symbols in FIG. 3 correspond to those in FIG. 1, and reference symbols $E_a$ and $E_b$ denote electrodes.

SUMMARY OF THE INVENTION

It is a principal object of the present invention to provide a phase-shift distributed-feedback semiconductor laser which has a narrow oscillation spectral width and can be stably oscillated.

There is provided according to the present invention a phase-shift distributed-feedback semiconductor laser wherein a proper electrode structure is used to obtain a narrow spectral width and to achieve stable, pure FM modulation free from an AM component.

DESCRIPTION OF THE PREFERRED EMBODIMENTS

Functions of the present invention will be described in detail with reference to preferred embodiments hereinafter.

Figure 4:
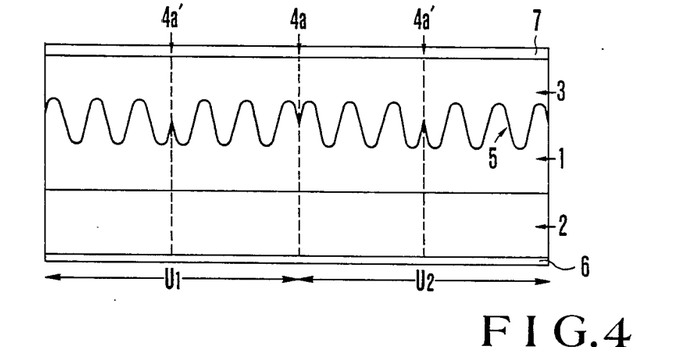
FIG. 4 is a sectional view showing a phase-shift distributed-feedback laser according to an embodiment of the present invention.

FIG. 4 shows a structure corresponding to the conventional structure of FIG. 1A according to a first embodiment of the present invention. As in FIGS. 1A and 1B, reference numeral 1 denotes an active layer for performing optical amplification; 2 and 3, cladding layers formed on both major surfaces of the active layer 1 to confine light; 5, a diffraction grating formed between the cladding layers 2 and 3 to feed back light in a distributed manner; and $4a'$, ¼ wavelength shift portions having phase-shift distributed-feedback laser unit structures (U1 and U2). The ¼ wavelength shift portions $4a'$ are junction planes on which the phase of the diffraction grating is shifted by a ½ wavelength. Reference numeral $4a$ denotes a phase shift junction plane formed at a connecting portion between the unit structures U1 and U2 in the same conditions as in the junction planes $4a'$. Reference numerals 6 and 7 denote electrodes formed on the lower and upper surfaces of the cladding layers 2 and 3, respectively. One of the electrodes 6 and 7 may be divided electrodes. Referring to FIG. 4, cavity lengths (transverse lengths in FIG. 4) of the unit structures U1 and U2 are equal to each other, and the phase shift junction planes $4a'$ are formed at central portions of the unit structures. As a whole, the spatial modulation phase of the equivalent refractive index is shifted by a ½ wavelength at each of four points which equally divide the cavity.

As described in the conventional examples, the phase difference of the ½ wavelength of the spatial modulation of the refractive index causes to the phase shift of the ¼ wavelength for the optical field. Therefore, an equivalent effect can be obtained as in formation of the portions for shifting the optical phases by the ¼ wavelength at the above points.

The following conclusions are derived from a detailed mode analysis of such a structure:

(i) In the same manner as in the conventional structure, the lowest order mode is a single mode in which the oscillation frequency coincides with the Bragg frequency $f_0$, thereby obtaining stable single mode oscillation.

(ii) $\alpha_{th}L$ corresponding to equation (2) is given as follows when $\kappa L$ is large:

$$\alpha_{th}L = (\kappa L/2)(1/sinh(\kappa L/4))((cosh(\kappa L/4) - sinh(\kappa L/4)) \quad (3)$$

Figure 5A:
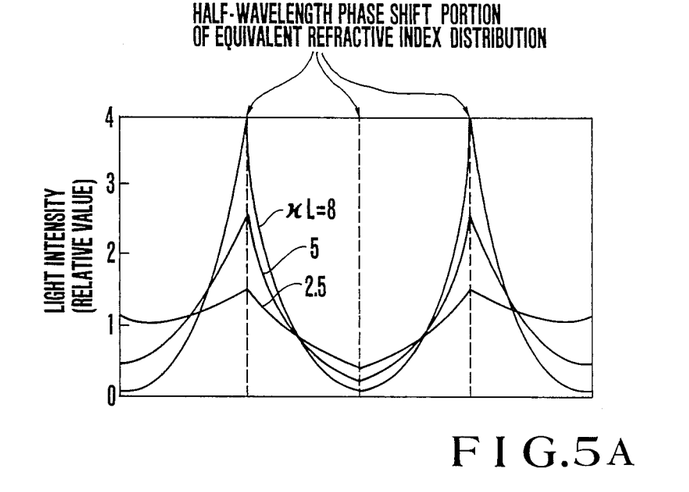
FIGS. 5A to 5C are views showing a light intensity distribution, its feedback mechanism and the structure of a phase-shift distributed-feedback laser according to the present invention.
Figure 5B:
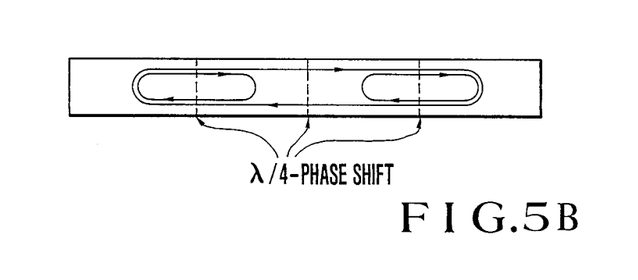
Figure 5C:
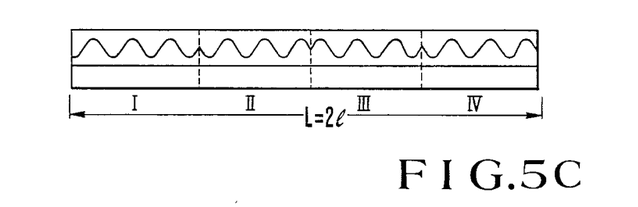

A comparison between equations (2) and (3) yields a conclusion in which identical $\alpha_{th}L$ values can be obtained when $\kappa$ is kept constant and L is doubled. As a result of the mode analysis of the structure shown in FIG. 4, the same light intensity distribution as in the cavity shown in FIG. 1A can be obtained. FIG. 5B is the diagram showing the feedback relation in the cavity. The light components travelling in the areas I and II are stably coupled to light components travelling in the areas III and IV. FIG. 5C corresponds to FIG. 4 and is given to be corresponded to FIGS. 5A and 5B. The intensity distribution is changed by changing $\kappa L$ in FIG. 5A. When the conventional single phase-shift DFB structure (FIG. 2) is compared with the structure of the present invention (FIG. 5A), the light intensity distribution of the structure of this embodiment is substantially the same as that of the conventional structure. The conventional structure and the structure of the present invention have an equivalent degree of hole burning effect.

In this embodiment as described above, mode stability can be set to be equal to that of the single phase-shift DFB laser. As is apparent from FIG. 5A, in a structure having a larger $\kappa L$, the cavity length L can be doubled while mode stability is maintained to be equal to that in the structure of FIG. 2. In addition, when the most stable structure was obtained in the present invention, the feedback strength $\kappa L$ was not sufficiently large and was found to be $\kappa L = 2.5$. When this feedback strength was given, the cavity length L was found to be increased to about 5 times and the oscillation spectral width $\Delta \nu$ decreased to about ten times.

The strength of spatial hole burning upon an increase in current J can be obtained by a rate equation, and a change in external coupling loss in the mode derived by a refractive index change caused by this hole burning effect is determined by a perturbation theory of the coupled mode equation. By using these two equations, the $\alpha_{th}L$ values can be determined as a function of the injection current J. Thus, a maximum current Jmax for keeping the lowest order mode stable is determined. In this case, if the maximum current Jmax is excessively large, unstable operations caused by other other reasons, e.g., heat, occur. If the maximum current Jmax exceeds an experimental upper limit, i.e., $3 \times J_{th}$, the **maximum current Jmax must be fixed to the experimental upper limit. A substitution of the maximum current Jmax into equation (1) yields the oscillation spectral widths $\Delta \nu$ of the conventional single phase DFB structure (FIGS. 1A and 1B) and the two-element coupled phase-shift DFB structure (FIG. 4), as indicated by curves a and b in FIG. 8. In this case, the following conditions were set: $\alpha 0 = 20$ cm$^{-1}$, the optical confinement coefficient = 0.2, the active layer thickness = 0.13 $\mu$m, the active layer width = 6 $\mu$m, and other material parameters for the conventional 1.5-$\mu$m InGaAsP. The feedback strength $\kappa L$ was given to be $\kappa L = 2.5$ for the curve b of this embodiment, while the feedback strength $\kappa L$ was given to be $\kappa L = 1.25$ for the curve a of the conventional single phase-shift DFB laser. These structures can perform stablest oscillation under these conditions. In this embodiment, since the Fmax value is higher than that of the conventional single phase-shift DFB structure, the minimum oscillation spectral width $\Delta \nu$ (a saturated portion indicated by the dash-dotted line b) can be improved by about 10 times.

In the above embodiment, the number of phase shift points is three (in other words, the two identical phase-shift DFB structure elements are coupled). It is natural that an n-element phase-shift DFB structure can generally have $(2n-1)$ (where n is a positive integer of 2 or more) phase-shift portions. In this case, the length can be increased by $(n \times L)$ times or more, while mode stability is maintained constant. In this case, the oscillation spectral width $\Delta \nu$ can be reduced to $1/n$ or less. Even when the total cavity length is sufficiently large, n can be selected to sufficiently suppress oscillation of a higher mode. Therefore, a ratio $J/J_{th}$ in equation (1) can be set to be a sufficiently high value, e.g., 3. In this case, L dependency of $\Delta \nu$ is represented by a curve c in FIG. 8. Therefore, when the overall cavity length L is further increased, the oscillation spectral width $\Delta \nu$ can be further decreased.

Figure 6:
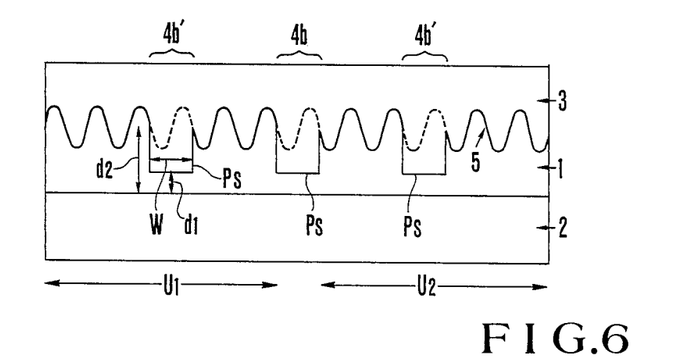
FIGS. 6 and 7 are sectional views of phase-shift distributed-feedback lasers according to other embodiments of the present invention.

FIG. 6 shows a second embodiment of the present invention. The thickness of the active layer is partially changed to obtain a phase shift portion Ps in the same manner as in the conventional example of FIG. 1B, and a diffraction grating is eliminated in Ps portions. In this manner, the optical phase can be changed by the ¼ wavelength. The same effect as in the first embodiment shown in FIG. 4 can be obtained. In addition to this effect, the number of phase shift DFB laser unit structures to be bonded as described in the first embodiment is not limited to 2, but can be increased to three or more, thus further improving the effect.

Figure 7:
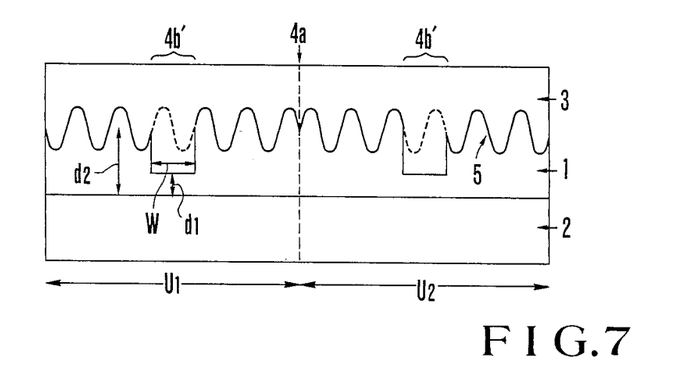

FIG. 7 shows a third embodiment of the present invention. Phase shift DFB laser unit structures U1 and U2 for shifting the optical phase by the ¼ wavelength are the same as those in FIG. 1B, and a portion for coupling the unit structures U1 and U2 is the one shown in FIG. 1A. As previously described, in the portions $4a$ and $4b$ in FIGS. 1A and 1B, the optical phase is shifted by the ¼ wavelength between the unit structures U1 and U2. Even if these portions are mixed in the structure shown in FIG. 7, the same function and effect as in FIG. 4 can be obtained.

Although omitted in the drawings, a coupling portion between the unit structures U1 and U2 may be constituted by the portion $4b'$, and the portions $4a$ may be provided in the respective unit structures (U1 and U2). When a plural number of unit structures are combined, the portions for changing the optical phase by the ¼ wavelength may be obtained by an arbitrary combination of the portions $4a$ and $4b$.

Figure 9:
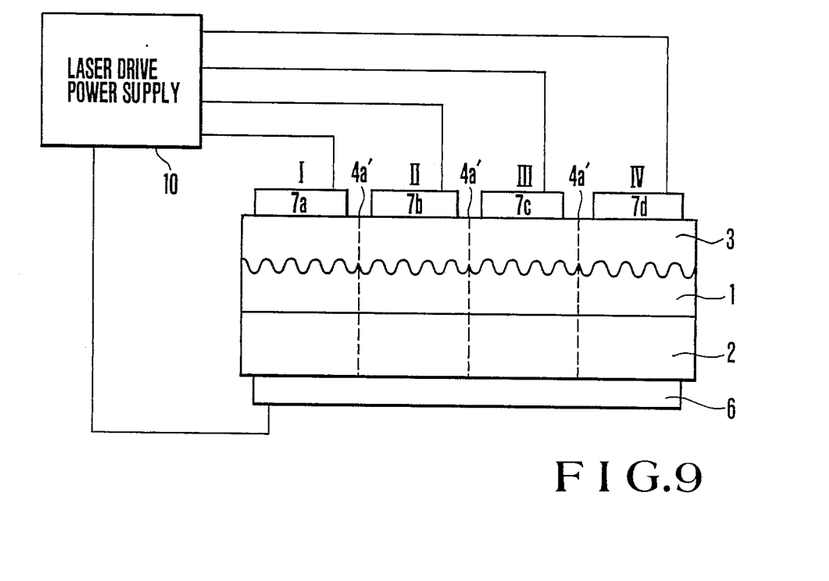
FIG. 9 is a sectional view of a phase-shift distributed-feedback laser according to still another embodiment of the present invention.

FIG. 9 shows still another embodiment in which a phase-shift distributed-feedback semiconductor laser is used as an FM light source. The same reference numerals as in the previous embodiments denote the same parts in this embodiment. A device shown in FIG. 9 is a combination of four distributed-feedback semiconductor lasers I, II, III, and IV. Three phase shift planes $4a'$ for shifting the optical phase by the ¼ wavelength are formed between the lasers I and II, the lasers II and III, and the lasers III and IV, respectively. These phase-shift portions $4a'$ are formed such that the lasers I and II, the lasers II and III, and the lasers III and IV are brought into tight contact with each other in the same manner as in FIG. 4 and that the phase of the active layer thickness modulation for giving each DFB structure is shifted by a ½ wavelength at the phase-shift portions. The phase-shift portion can be constructed by the elimination of the active layer thickness modulation as shown in FIG. 6. Alternatively, the lasers I and II are separated from each other and the optical distance between the lasers I and II is determined to be a phase difference of a ¼ wavelength so as to interpose an air layer therebetween, and light reflection at both facets is prevented. In addition, the combination as shown in FIG. 7 may be employed.

In the above embodiment, a common electrode 6 is formed on a cladding layer 2, and electrodes $7a$ to $7d$ are formed on a cladding layer 3 in units of lasers. These electrodes are connected to a laser drive power supply 10.

With the above construction, when the laser drive power supply 10 is driven to supply a constant current to the electrodes $7a$ to $7d$ to oscillate the laser, stable single mode operation is performed so as to allow the oscillation frequency to coincide with the Bragg frequency and the oscillation spectral width is narrowed, as described in the previous embodiments. In the present embodiment, the modulation current is applied to each electrode at different timings. In this case, the carrier density in the active layer in the i-th (i=I, II, III, and IV) laser is changed. A change in the number of carrier in a semiconductor causes a change in refractive index. Therefore, coupled mode equations for determining the optical field R travelling to the right and the optical field S travelling to the left in the i-th area of the laser are given as follows:

$$-dR/dz + (\alpha_{th} - j\delta + 2\pi j \Delta \eta_i / \lambda)R = j\kappa S \qquad (4)$$

$$-dS/dz + (\alpha_{th} - j\delta + 2\pi j \Delta \eta_i / \lambda)S = j\kappa R \qquad (5)$$

where $\lambda$ is the Bragg wavelength, $\Delta \eta_i$ is the change in refractive index caused by current injection, $\alpha_{th}$ is the threshold gain, and $\delta$ is the deviation of the oscillation frequency from the Bragg frequency. The phase of the optical field between the areas is subjected to ¼ wavelength shifting. Reflection from the both facets can be prevented by an anti-reflection coating.

When the injection current is changed, an optical output, its amplitude, and its frequency are changed accordingly. In the present embodiment, the current modulation scheme is such that the modulation performed in the lasers I and IV has a polarity opposite to that in the lasers II and III but has the same magnitude as that therein. This modulation scheme is called as quadrupolar, push-pull modulation. An eigenvalue equation of this system can be obtained by using equations (4) and (5) for these lasers and the boundary conditions. The eigenvalue equation is linearly approximated to obtain deviations $\Delta \alpha_{th}$ and $\Delta \delta$ from the values $\alpha_{th}$ and $\delta$ for the zero modulation current as follows:

$$\Delta \alpha_{th} - j\Delta \delta = \pm K 2\pi \Delta \eta / \lambda \qquad (6)$$

where K is the function of $\alpha_{th}$ and $\delta$, i.e., the function of $\kappa L$ which is the product of the DFB feedback strength $\kappa$ and the overall cavity length L. According to this calculation, K is given as a real value for $\delta = 0$ as is the case for the present invention, the coupled phase shift DFB laser. Equation (6) provides $\Delta \alpha_{th} = 0$ and $\Delta \delta = -K 2\pi \Delta \eta / \lambda$. In quadrupolar, push-pull modulation, a sum of all modulation currents is zero. Therefore, if $\Delta \alpha_{th} = 0$, no AM modulation is obtained. However, since $\Delta \delta \neq 0$, pure FM modulation is obtained.

Table I shows results obtained according to different current modulation schemes:

TABLE I

| Modulation scheme* | | | | Frequency modulation | Amplitude modulation |
|---|---|---|---|---|---|
| a | + | − | − | + | yes | no |
| b | + | − | + | − | no | no |
| c | + | + | − | − | no | no |
| d | + | − | 0 | 0 | yes | no |
| e | + | 0 | − | 0 | yes | no |
| f | + | 0 | 0 | − | no | no |

*+, −, and 0 indicate the relation of the modulation current polarities.

Schemes a, d, and e provide pure FM modulation. Therefore, in order to achieve pure FM modulation, a modulation current applied to the two outer ones of the four divided electrodes has a polarity opposite to that applied to the two inner ones but has the same magnitude as that of the two inner electrodes. Thus, the pure FM can be obtained when the total modulation current applied to the two outer electrodes has a polarity opposite to that applied to the two inner ones but has the same magnitude. These modulation schemes are called as quadrupolar, push-pull modulation schemes.

A calculation equation for the FM modulation depth is given as follows. In equation (6), $\Delta\eta$ is caused by modulation $\Delta n$ of the carrier density, and their relationship is given by:

$$\Delta\eta = (\lambda\alpha/2\pi)a_g\Delta n \tag{7}$$

where $a_g$ is the differential gain and $\alpha$ is a linewidth enhancement factor of the semiconductor laser. Since the value $\Delta\delta$ is easily converted into the frequency displacement $\Delta f$, equations (6) and (7) give a ratio of the FM modulation depth $\Delta f$ to the frequency f as:

$$\Delta f/f = (K\lambda\alpha A g\Gamma/2\pi\eta)\Delta n \tag{8}$$

Figure 10:
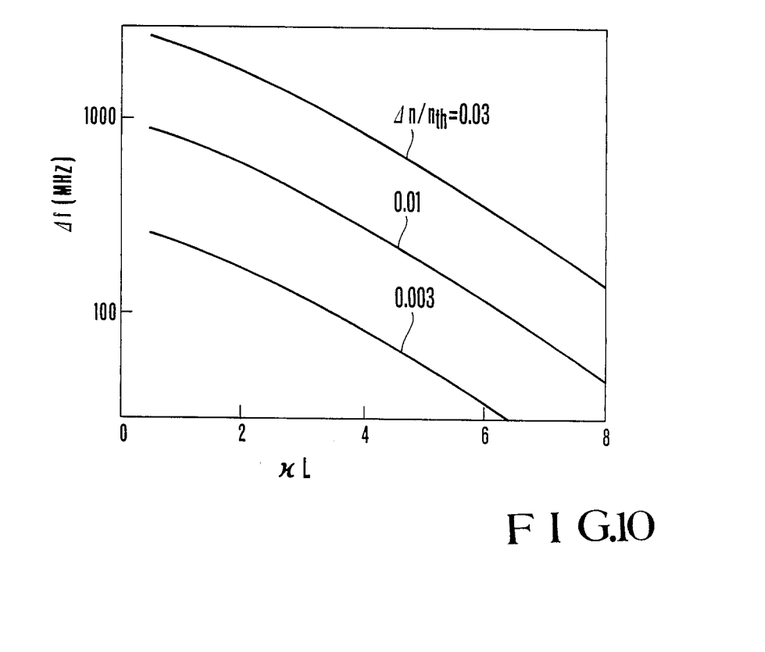
FIG. 10 is a graph showing $\kappa L - \Delta f$ characteristic curves for explaining the operation of the laser shown in FIG. 9.

Results representing $\kappa L$ dependency of $\Delta f$ in the 1.55-μm InGaAsP coupled phase-shift DFB laser for different $\Delta n/n_{th}$ are shown in FIG. 10. As described in the previous embodiment, the feedback strength, $\kappa L$ for giving the narrowest spectral line width is 2.5. If $\kappa L = 2.5$ and 1% carrier density modulation is performed, then $\Delta f$ is about 500 MHz.

In the above discussion, the lengths of the divided DFB lasers are equal to each other. Pure FM modulation is caused only by the presence of a ¼ wavelength phase shift. Therefore, pure FM modulation can be achieved even if the lengths of the divided DFB lasers slightly vary.

In summary, in the embodiment shown in FIG. 9, three phase-shift portions are formed in a DFB laser and modulation currents of opposite polarities are supplied to the four divided portions in a quadrupolar manner. The center frequency and the FM modulation characteristics are determined when a device of this structure is manufactured, and thus no adjustment for the operating conditions is necessary during the operation. Therefore, a long term operation stability is assured, variations in device performance are small, and uniform device characteristics can be obtained. These results are important specially in the applications where plural number of the devices are used at remote locations.

The present invention is not limited to the particular embodiments described above. Various changes and modifications may be made within the spirit and scope of the invention.

What is claimed is:

1. A phase-shift distributed-feedback semiconductor laser including at least two electrodes for injecting a current to an entire area of said semiconductor laser, comprising portions, each for shifting an optical phase by a ¼ wavelength at least three locations, the number of which is an odd number, said portions being formed inside a laser cavity in an optical path of a phase shift distributed, feedback semiconductor laser structure in a light propagation direction of the phase-shift distributed-feedback semiconductor laser structure.

2. A laser according to claim 1, wherein said phase-shift distributed-feedback semiconductor laser structure comprises a plurality of units each having said ¼ wavelength phase-shift portion at a central portion thereof, and a ¼ wavelength phase-shift connecting portion for connecting said units so as to shift the optical phase by a ¼ wavelength between said units.

3. A laser according to claim 1, wherein said ¼ wavelength phase-shift portion is constituted by a junction plane where a phase of a diffraction grating constituting said phase-shift distributed-feedback semiconductor laser structure is shifted by a ½ wavelength.

4. A laser according to claim 1, wherein said ¼ wavelength phase-shift portion is formed by partially removing a diffraction grating constituting said phase-shift distributed-feedback semiconductor laser structure.

5. A laser according to claim 1, wherein said respective ¼ wavelength phase-shift portions are formed by combining a junction plane where a phase of a diffraction grating constituting said phase-shift distributed-feedback semiconductor laser is shifted by a ½ wavelength and a portion obtained by partially removing said diffraction grating constituting said phase-shift distributed-feedback semiconductor laser structure.

6. A laser according to claim 1, including said ¼ wavelength phase-shift portions, and wherein said electrode is formed on an entire surface along the light propagation direction.

7. A laser according to claim 1, wherein said ¼ wavelength phase-shift portions are three in number, and further comprising four separate electrodes divided by said ¼ wavelength phase-shift portions, and a common electrode formed to oppose said four separate electrodes, two inner ones of said four separate electrodes being applied with a modulation current having a polarity opposite to that applied to two outer ones of said four separate electrodes but the same magnitude as that of said two outer electrodes.

* * * * *